(12) United States Patent
Zheng

(10) Patent No.: US 6,992,373 B2
(45) Date of Patent: Jan. 31, 2006

(54) STACKED LAND GRID ARRAY PACKAGE

(75) Inventor: Tieyu Zheng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/844,765

(22) Filed: May 13, 2004

(65) Prior Publication Data

US 2005/0253246 A1    Nov. 17, 2005

(51) Int. Cl.
*H01L 23/02* (2006.01)
*H02B 1/00* (2006.01)

(52) U.S. Cl. .................. 257/678; 361/600; 361/679

(58) Field of Classification Search .............. 257/678; 361/600, 679, 683
See application file for complete search history.

(56) References Cited

U.S. PATENT DOCUMENTS 6,574,101 B2 * 6/2003 Tanaka et al. .............. 361/687

* cited by examiner

*Primary Examiner*—Douglas W. Owens
(74) *Attorney, Agent, or Firm*—Trop, Pruner & Hu, P.C.

(57) ABSTRACT

A spring plate may be provided between a bolster plate and a board in order to mount components on the opposite side of the board. In some embodiments, the spring plate may provide additional stack tolerance and forceful bias to hold the stack tightly together.

10 Claims, 3 Drawing Sheets

STACKED LAND GRID ARRAY PACKAGE

BACKGROUND

This invention relates generally to packaging integrated circuits.

Integrated circuits, such as microprocessors, may be packaged in various configurations. One such configuration is called a land grid array package. With land grid array packaging, integrated circuit die may be coupled to circuit boards through sockets that electrically and mechanically couple the integrated circuit die to the circuit board. In some cases, the connection may be via socket spring fingers which contact lands on the integrated circuit packages to make a land grid array connection system.

Often, a number of components may be connected together to form a stack. In one example a voltage regulator module board may be assembled on a motherboard through a land grid array connector. The voltage regulator module and motherboard are clamped together between a bolster plate under the motherboard. A heat sink may be positioned on top of the voltage regulator module board. Pairs of standoffs on the bolster plate are used to control the space in between the bolster plate and the heat sink.

Due to the dimensional tolerances of the mechanical parts, the distance between the bolster plate and the heat sink varies on individual assembly. Part of this stack tolerance can be absorbed by the flexibility of the land grid array springs. However, the bending range of land grid array springs is limited and cannot absorb the entire stack tolerance.

In the meantime, a certain level of pressure is required to press the land grid array onto the land pads on the motherboard to meet the requirement of good electrical design.

Thus, there is a need for better ways to connect integrated circuits to boards in the form of stacks.

DETAILED DESCRIPTION

Figure 1:
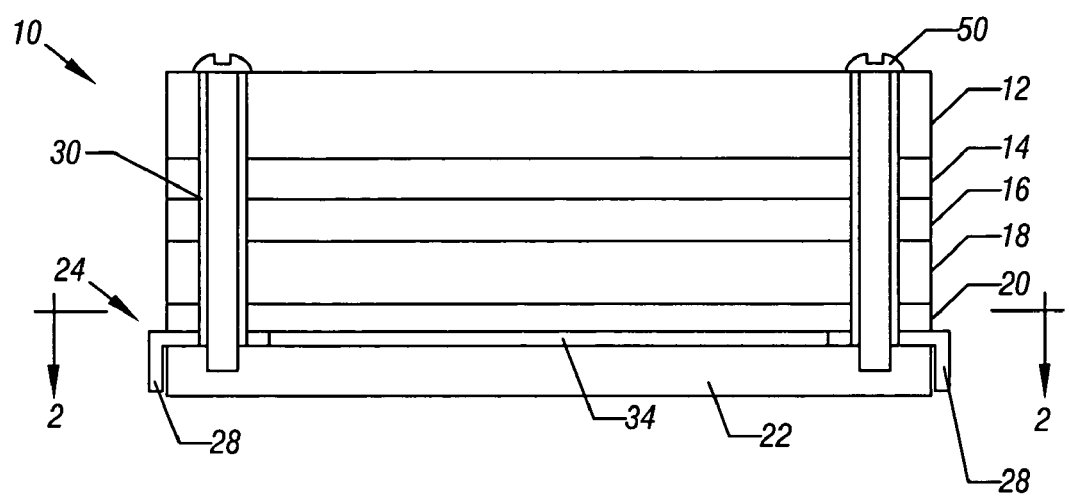
FIG. 1 is an enlarged, cross-sectional view through one embodiment of the present invention.

Referring to FIG. 1, a land grid array package stack 10 may include a voltage regulator module heat sink 12 mounted on a voltage regulator module board 14. Under the board 14 may be a voltage regulator module socket or connector 16. The connector 16 may be positioned over a motherboard 18 which, in turn, is positioned over an insulator 20 in one embodiment. The board 14, connector 16, board 18, and insulator 20 may be mounted on a set of standoffs 30 which allow relative vertical movement of the stack 10 while controlling the side to side or lateral movement thereof. A screw 50, in turn, is connected through the standoffs 30 to a bolster plate 22 on the bottom of the stack 10 to hold the stack 10 together. Between the bolster plate 22 and the board 18 is positioned a spring plate 24.

In some embodiments, the spring plate 24 provides the required pressing load on the back of the board 18 and thereafter on the land grid array connector 16, while absorbing the stack tolerance. As mentioned above, due to the dimensional tolerance of the mechanical parts, the distance between the bolster plate 22 and the heat sink 12 may vary on individual assembly. While part of this tolerance can be absorbed by the flexibility of the land grid array connector springs, the entire tolerance cannot be so absorbed. Thus, the spring plate 24 may function to absorb that tolerance. In some embodiments, the spring plate can supply a recovery force while reducing or even minimizing the tilting or uneven contact of the land grid array connector 16 on the board 18.

Figure 2:
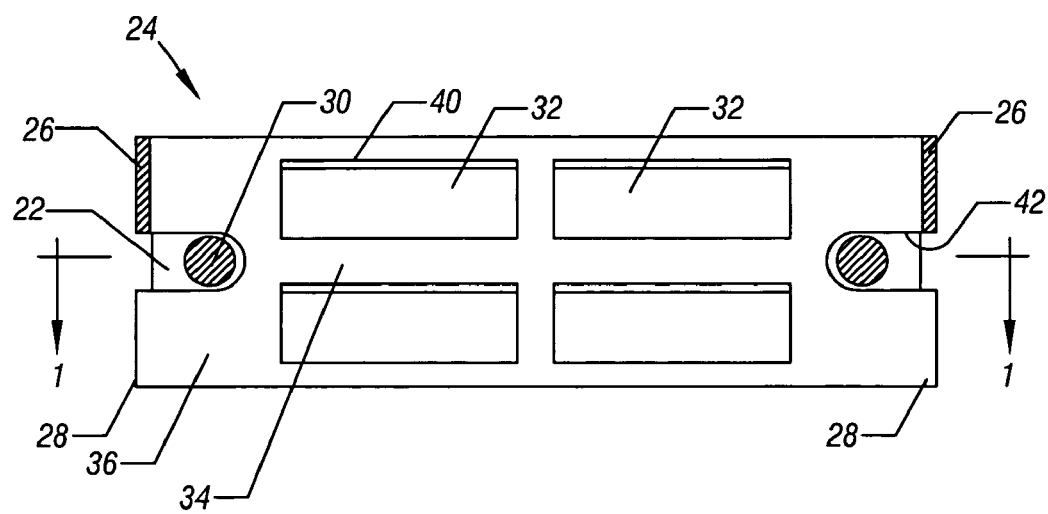
FIG. 2 is a cross-sectional view taken generally along the line 2—2 in FIG. 1.

To this end, the spring plate 24 may include two or more pairs of independent spring legs 32 as shown in FIG. 2. The spring plate 24 may be formed of stamped metal in one embodiment of the present invention. For example, the spring plate 24 may be made of BeCu alloy which has a lower Young's modulus and a higher yield strength than steel.

A set of four spring legs 32 may be positioned on the center bar 34 of the spring plate 24 in one embodiment. The spring legs 32 may be partially cut out of the rest of the plate 24 and may be bent upwardly, towards the board 18, as the spring legs extend away from the center bar 34. The free ends 40 of the spring legs 32 may be bent over to prevent gouging of the mating surfaces. The span in the spring legs 32 may be less than half of the plate 24 width in some embodiments.

Figure 3:
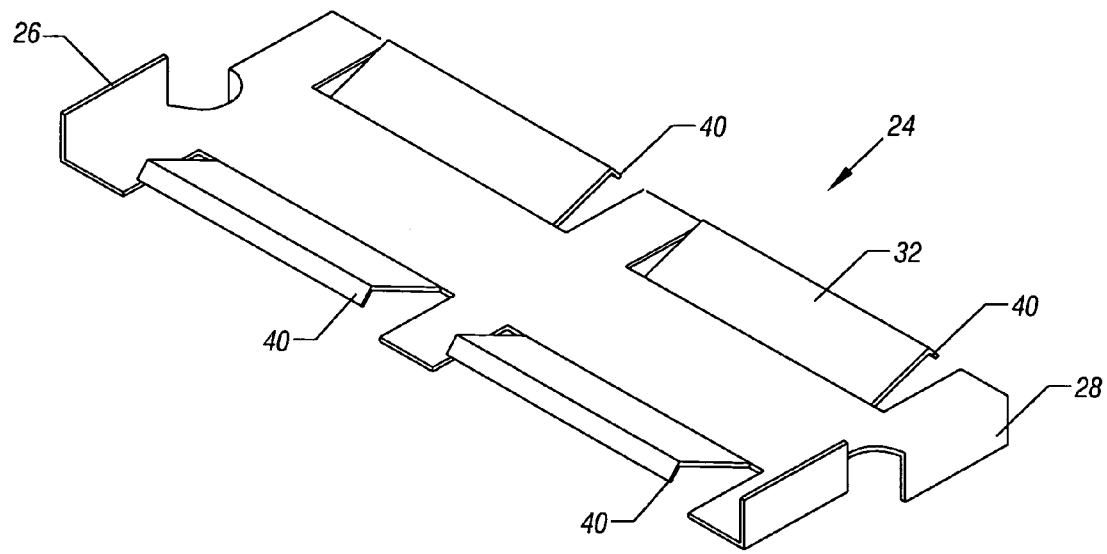
FIG. 3 is a perspective view of a spring plate in accordance with one embodiment of the present invention.

Clips 26 and 28 may be provided to ease assembly. For example, in one embodiment, the clips 28 extend downwardly from one half of the plate 24 while the clips 26 extend upwardly from the other half of the plate 24, as shown in FIG. 3. In other words, the clips 26 may engage the sides of the board 18 while the clips 28 engage the sides of the bolster plate 22 in one embodiment. The center bar 34 may include U-shaped openings 42 to receive the standoffs 30 in one embodiment of the present invention.

In some embodiments of the present invention, the spring plate 24 provides a low profile spring to absorb the stack tolerance while maintaining the desired pressure force in a limited space.

The spring legs 32 may be made by cutting and forming sheet metal in one embodiment of the present invention. For example, stamping may be utilized for this purpose.

The free ends 40 of the spring legs 32 are closer to the edges of the plate 24, while the lower ends sit closer to the plate center bar 34. The free ends 40 contact the object being supported. Larger spacing may be achieved between the free ends 40 due to this configuration which can supply a recovery force to reduce or minimize the tilting of the connector 16 relative to the board 18.

The height of the free ends 40 depends on the application and may be minimized to maintain a low profile in some embodiments. The free state height can be no larger than 10 percent of the plate 24 width in one embodiment of the present invention. The preload height can be less than one millimeter in one embodiment of the present invention. The use of the rounded free ends 40 may avoid any concentrated contact and scratching of other components in some embodiments.

The spring plate 24 uses a closed design as shown in FIG. 3 with turned free ends 40. The arms 32 may be straight as shown in FIG. 3. The plate 24 may provide better structural integrity in some embodiments.

Figure 4:
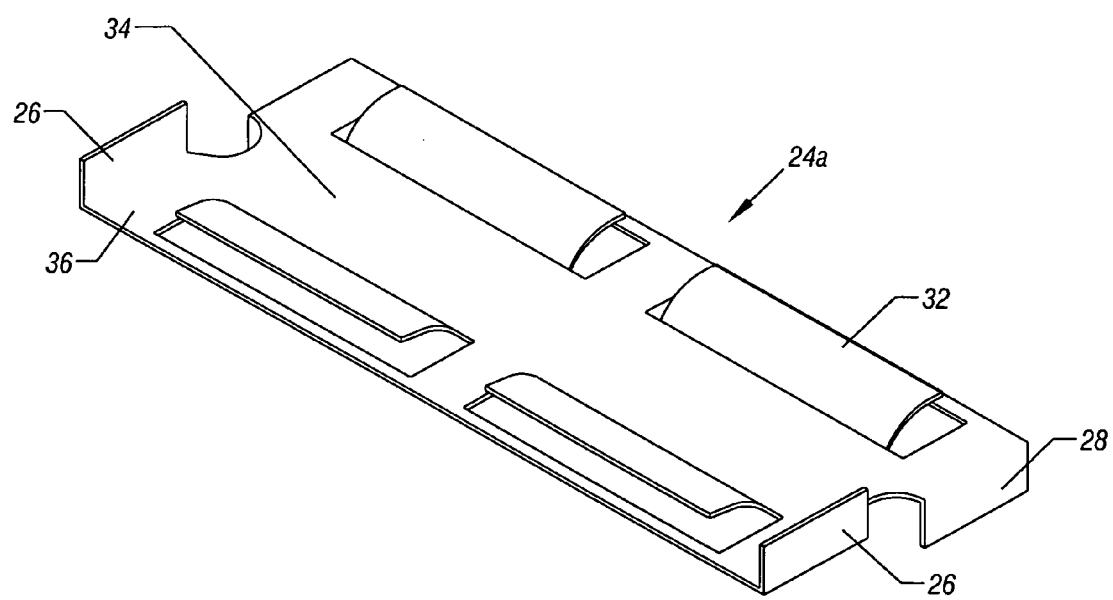
FIG. 4 is a perspective view of a spring plate in accordance with another embodiment of the present invention.

Alternatively, an opened design may be utilized in the plate 24a as shown in FIG. 4. In the opened design, there are no turned over free ends 40. In addition, the arms 32 may be curved. The opened design may provide for more flexibility in some embodiments.

In one embodiment of the present invention, the length of each spring leg 32 may be 16 millimeters and the span of the spring leg may be 4 millimeters. The free state height of the raised end 40 may be 1.5 millimeters with a plate thickness of 0.4 millimeters in such an embodiment. Such a structure can absorb a working stack tolerance range of about 0.6 millimeters, while maintaining the total pressing force at greater than 40 pounds.

Figure 5:
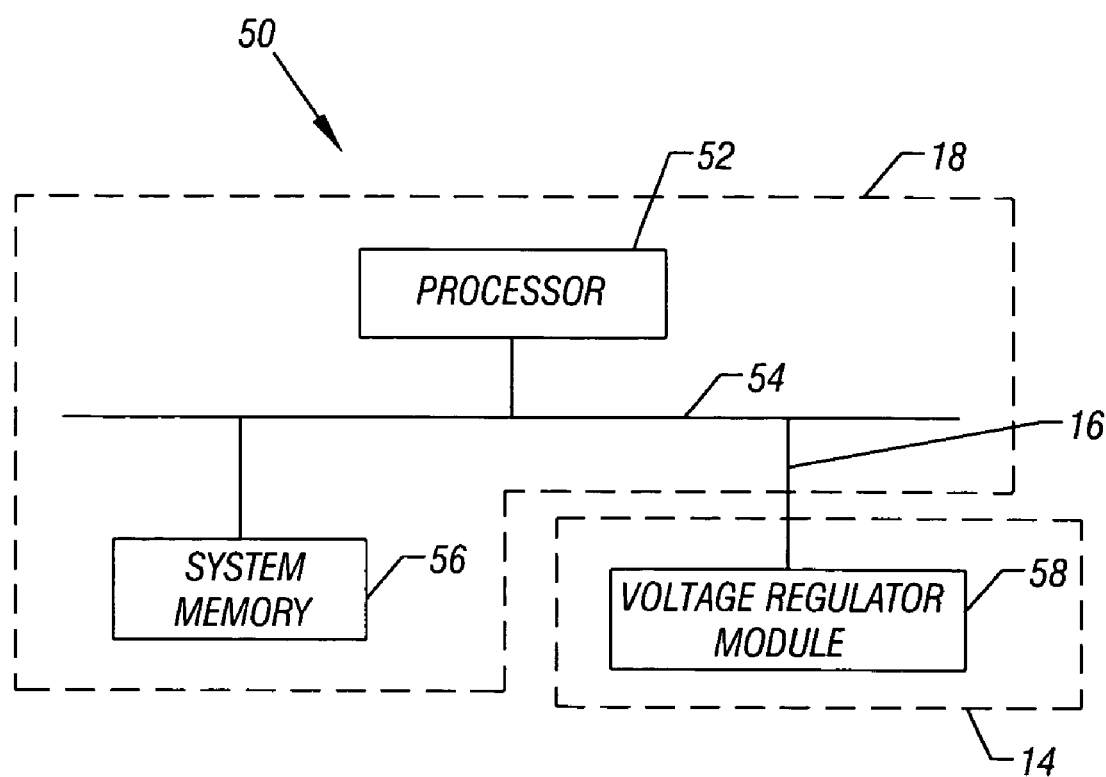
FIG. 5 is a system schematic according to one embodiment of the present invention.

Referring to FIG. 5, in accordance with one embodiment of the present invention, a system 50 may be implemented by a motherboard 18 and a voltage regulator module board 14. The motherboard 18 may include a processor 52, a system memory 56, and a bus 54. The connector 16 couples the voltage regulator module 58 to the bus 54. While FIG. 5 shows one system implementation of the present invention, those skilled in the art will appreciate that the present invention is in no way limited to any particular system implementation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit stack comprising:
   a first printed circuit board;
   a bolster plate;
   at least two standoffs extending through said boards and coupled to said bolster plate; and
   a spring plate between said first printed circuit board and said bolster plate.

2. The stack of claim 1 wherein said second printed circuit board is a voltage regulator module board mounted on said first printed circuit board said voltage regulator module board mounted on said standoffs.

3. The stack of claim 2 including a heat sink coupled on said voltage regulator module board.

4. The stack of claim 1 wherein said spring plate includes at least two leaf springs formed in said spring plate.

5. The stack of claim 4 wherein said spring plate includes a set of four spring arms cut from said plate.

6. The stack of claim 4 wherein said spring plate includes clips to retain said spring plate to said bolster plate and said first printed circuit board.

7. The stack of claim 4 wherein said spring plate includes apertures for said standoffs.

8. The stack of claim 4 wherein said leaf springs includes straight arms.

9. The stack of claim 4 wherein said leaf springs include curved arms.

10. The stack of claim 4 wherein said leaf springs include bent free ends.

* * * * *